United States Patent
Ogura et al.

(10) Patent No.: US 8,155,355 B2
(45) Date of Patent: *Apr. 10, 2012

(54) ELECTRET CONDENSER MICROPHONE

(75) Inventors: Hiroshi Ogura, Tokyo (JP); Tohru Yamaoka, Osaka (JP)

(73) Assignee: Panasonic Corporation, Osaka (JP)

( * ) Notice: Subject to any disclaimer, the term of this patent is extended or adjusted under 35 U.S.C. 154(b) by 659 days.

This patent is subject to a terminal disclaimer.

(21) Appl. No.: 12/276,820

(22) Filed: Nov. 24, 2008

(65) Prior Publication Data

US 2009/0080682 A1    Mar. 26, 2009

Related U.S. Application Data

(62) Division of application No. 10/592,116, filed as application No. PCT/JP2005/003031 on Feb. 24, 2005, now Pat. No. 7,466,834.

(30) Foreign Application Priority Data

Mar. 9, 2004    (JP) .................................. 2004-065190

(51) Int. Cl.
    *H04R 25/00*    (2006.01)
(52) U.S. Cl. .......................... 381/174; 381/175; 381/191
(58) Field of Classification Search .................. 381/113, 381/116, 173, 174, 175, 369, 191, 355; 367/170, 367/181; 29/25.41, 25.42, 594, 609.1; 257/704, 257/724, 729
    See application file for complete search history.

(56) References Cited

U.S. PATENT DOCUMENTS

| | | | |
|---|---|---|---|
| 5,452,268 A | 9/1995 | Bernstein | |
| 5,490,220 A | 2/1996 | Loeppert | |
| 6,744,896 B2 | 6/2004 | Tanabe et al. | |
| 6,847,090 B2 | 1/2005 | Loeppert | |
| 6,928,178 B2 | 8/2005 | Chang | |
| 7,166,910 B2 * | 1/2007 | Minervini | 257/704 |
| 7,242,089 B2 | 7/2007 | Minervini | |
| 7,292,696 B2 | 11/2007 | Saeki et al. | |
| 7,466,834 B2 * | 12/2008 | Ogura et al. | 381/174 |
| 7,853,027 B2 * | 12/2010 | Yamaoka et al. | 381/174 |
| 2003/0035558 A1 | 2/2003 | Kawamura et al. | |
| 2003/0068055 A1 | 4/2003 | Tanabe et al. | |
| 2008/0063232 A1 * | 3/2008 | Song | 381/355 |

FOREIGN PATENT DOCUMENTS

| | | |
|---|---|---|
| JP | 11-121116 | 4/1999 |
| JP | 11-187494 | 7/1999 |
| JP | 11-266499 | 9/1999 |
| JP | 2002-320294 | 10/2002 |
| JP | 2003-078981 | 3/2003 |

(Continued)

*Primary Examiner* — Huyen D Le

(74) *Attorney, Agent, or Firm* — McDermott Will & Emery LLP

(57) ABSTRACT

An electret condenser microphone includes: a substrate 13 in which an opening 25 is formed; an electret condenser 50 connected to one face of the substrate 13 so as to close the opening 25 and having an acoustic hole 12 and a cavity 2; a drive circuit element 15 connected to the one face of the substrate 13; and a case 17 mounted over the substrate 13 so as to cover the electret condenser 50 and the drive circuit element 15. Electric contact is established at a joint part between the electret condenser 50 and the substrate 13. The acoustic hole 12 communicates with an external space through the opening 25. The cavity 2 and an internal region of the case 17 serve as a back air chamber for the electret condenser 50.

52 Claims, 4 Drawing Sheets

FOREIGN PATENT DOCUMENTS

| | | |
|---|---|---|
| JP | 2003-125495 | 4/2003 |
| JP | 2003-163996 | 6/2003 |
| JP | 2004-510373 | 4/2004 |
| WO | WO 02/37893 A1 | 5/2002 |

* cited by examiner

FIG. 1
(a)
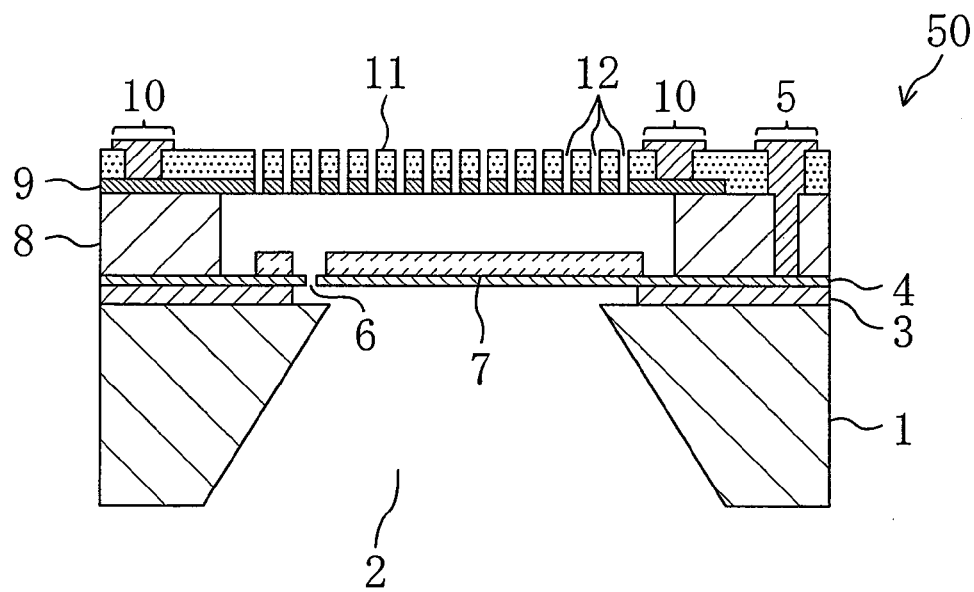
(b)
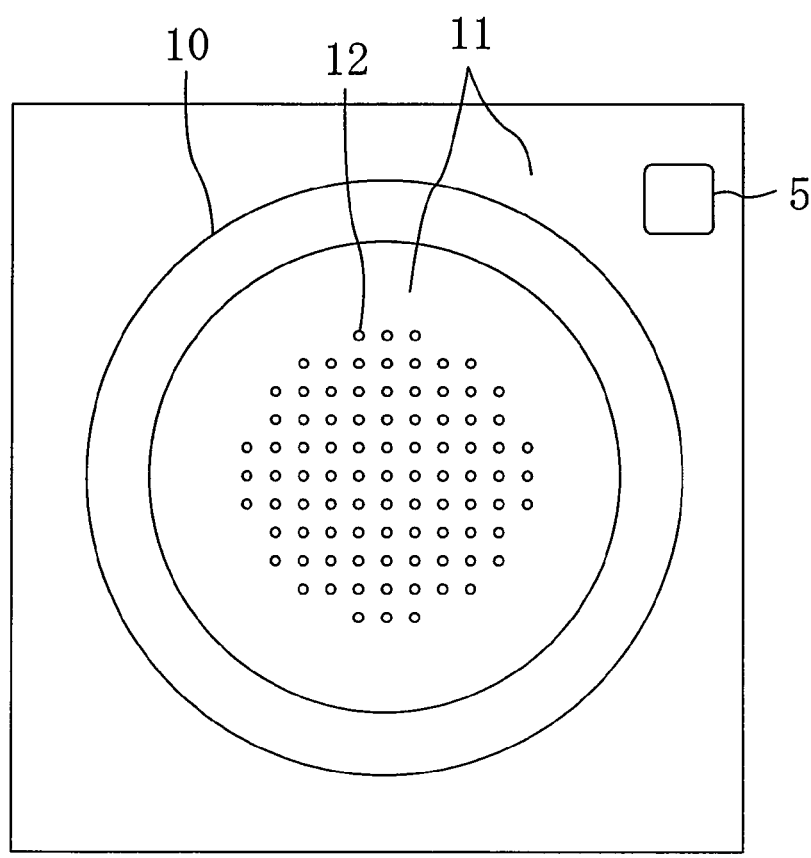

FIG. 4 (a) (b)

ELECTRET CONDENSER MICROPHONE

RELATED APPLICATIONS

This application is a Divisional of U.S. application Ser. No. 10/592,116, filed Sep. 8, 2006, now U.S. Pat. No. 7,466,834, which is a U.S. National Phase under 35 U.S.C. §371 of International Application No. PCT/JP2005/003031, filed on Feb. 24, 2005, claiming priority of Japanese Application No 2004-065190, filed on Mar. 9, 2004, the entire contents of each of which are hereby incorporated by reference.

TECHNICAL FIELD

The present invention relates to an electret condenser microphone including a vibrating electrode, and particularly relates to a structure of an electret condenser microphone (ECM) carrying an electret condenser formed using a MEMS (Micro Electro Mechanical System) technology.

BACKGROUND ART

Conventionally, predominant condenser microphones are microphones in which components, such as a diaphragm, a fixed electrode, and the like separately manufactured by a mechanical processing or the like are incorporated, as disclosed in Patent Document 1. These microphones are called ECMs (Electret Condenser Microphones), and miniaturization thereof has been tackled. As a result, a product having a diameter of 6 mm and a thickness of 1 mm and a product having a diameter of 4 mm and a thickness of 1.5 mm, and the like have been on sale. However, an ECM of the type disclosed in Patent Document 1, which uses mechanically-processed components, encounters difficulty in miniaturization.

A processing technology applying a semiconductor integrated circuit fabrication method, which is different from the conventional mechanical processing, is called a MEMS technology or a micro machining technology and is effective in miniaturization of microphones. Under the circumstances, microphone manufacturing methods using the MEMS technology have been proposed. For example, Patent Document 2 discloses a method of manufacturing a microphone with no electret with the use of the MEMS technology.

Patent Document 1: Japanese Patent Application Laid Open Publication No. 11-187494A Patent Document 2: Japanese Patent Application Laid Open Publication No. 2003-78981A

Problems that the Invention is to Solve

An electret condenser microphone having the structure disclosed in Patent Document 2, however, involves the following problems.

Namely, since the condenser and a drive circuit element, such as an IC are connected to each other with the use of a bonding wire, electric loss occurs in the bonding wire.

Further, as the condenser is reduced in size, the back air chamber integrally formed with the condenser is also reduced in size, degrading high-frequency characteristic of the microphone with the reduced back air chamber. As a result, a microphone exhibiting excellent performance cannot be manufactured.

The present invention has been made in view of the foregoing and has its object of providing an electret condenser microphone having a structure excellent in high-frequency characteristic even when miniaturized.

Means for Solving the Problems

To attain the above object, an electret condenser microphone according to the present invention includes: a substrate in which an opening is formed; an electret condenser connected to one face of the substrate so as to close the opening and having an acoustic hole and a cavity; a drive circuit element connected to the one face of the substrate; and a case mounted over the substrate so as to cover the electret condenser and the drive circuit element, wherein electric contact is established at a joint part between the electret condenser and the substrate, the acoustic hole communicates with an external space through the opening, and the cavity and an internal region of the case serve as a back air chamber for the electret condenser.

EFFECTS OF THE INVENTION

In the present invention, electric contact between the substrate and the electret condenser is established at a mechanical contact part therebetween, in other words, the substrate and the electret condenser are connected to each other electrically without using a wire bonder, suppressing parasitic capacitance and noise occurrence caused due to the presence of the bonding wire. This enhances the high-frequency characteristic of the electret condenser. Further, the substantial volume of the back air chamber of the electret condenser can be increased by utilizing the space (the internal region of the case) formed by the case that covers the electret condenser, so that the high-frequency characteristic of the condenser can be enhanced even when the electret condenser is miniaturized.

As described above, according to the present invention, a small-size electret condenser microphone excellent in high-frequency characteristic can be provided.

BRIEF DESCRIPTION OF THE DRAWINGS

FIG. 1(*a*) is a sectional view of an electret condenser carried by an electret condenser microphone according to one embodiment of the present invention, and FIG. 1(*b*) is a plan view of the electret condenser.

Figure 2:
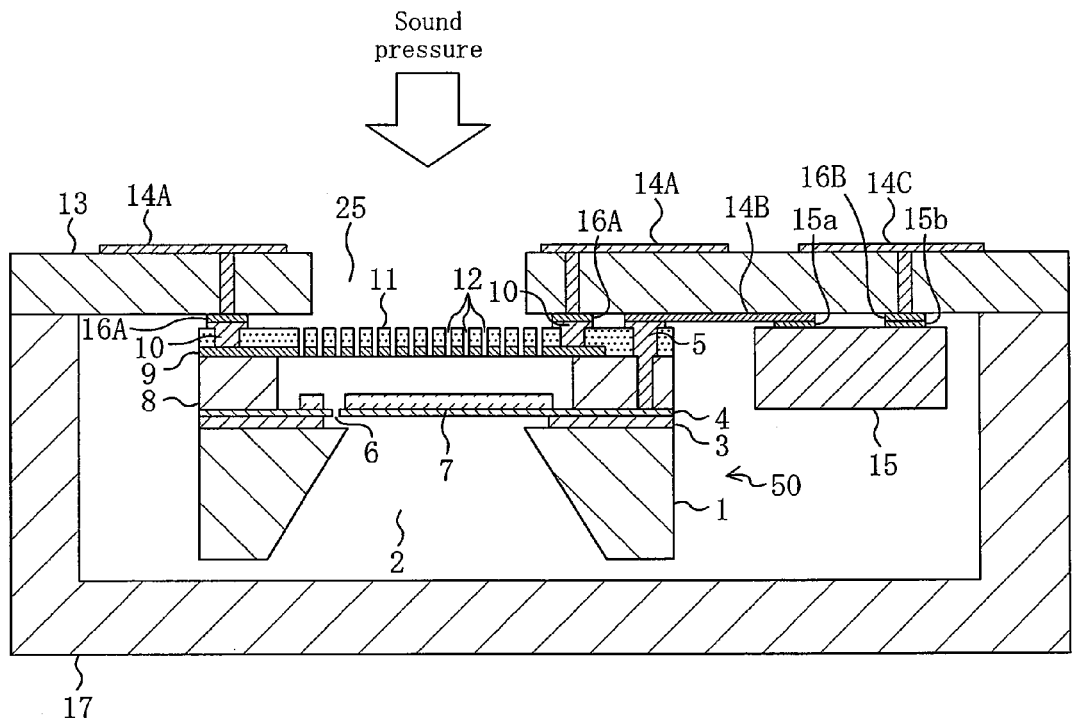
FIG. 2 is a sectional view of the electret condenser microphone according to the embodiment of the present invention.

EXPLANATION OF REFERENCE NUMERALS 1 silicon substrate
2 cavity
3 insulating film
4 lower electrode
5 extraction electrode
6 leak hole
7 electret film
8 insulating film
9 upper electrode
10 contact
11 insulating film 12 acoustic hole
13 substrate
14 wire
15 IC element
16 contact
17 case
18 protrusion
19 anisotropic conductive resin
20 contact
21 wire
22 substrate
25 opening

BEST MODE FOR CARRYING OUT THE
INVENTION

An electret condenser microphone according to one embodiment of the present invention will be described below with reference to the accompanying drawings.

First of all, a description will be given to an electret condenser (hereinafter referred to as an electret condenser of the present invention) carried by an electret condenser microphone according to the present embodiment. The electret condenser of the present invention is manufactured by a processing method called surface micro machining in the MEMS technology which uses only a single silicon substrate.

FIG. 1(a) and FIG. 1(b) are a sectional view and a plan view of an electret condenser 50 of the present invention, respectively.

As shown in FIG. 1(a) and FIG. 1(b), a cavity 2 is formed in a silicon substrate 1 by anisotropic etching, and an insulating film 3 formed of, for example, a silicon oxide film and a lower electrode 4 formed of, for example, a polysilicon film doped with phosphorus are formed on the substrate 1 in this order. Part of the insulting film 3 located above the cavity 2 is removed, and the lower electrode 4 is formed so as to cover the cavity 2. An electret film 7 formed of, for example, a silicon oxide film is provided on part of the lower electrode 4 located above the cavity 2. An insulating film 8 formed of, for example, a silicon oxide film is provided on part of the lower electrode 4 located above the external part of the cavity 2, and an upper electrode 9 is provided above the lower electrode 4 with the insulating film 8 interposed as a spacer therebetween. The surface of the upper electrode 9 is covered and protected with an insulating film 11 formed of, for example, a silicon nitride film.

An extraction electrode 5 electrically connecting to the lower electrode 4 is provided in the insulating film 8 and the insulating film 11. The extraction electrode 5 protrudes from the insulating film 11. A leak hole 6 communicating with the cavity 2 is formed in the lower electrode 4 and the electret film 7 so as not cause pressure difference between a region above and a region below the electret film 7. Further, a contact 10 electrically connecting to the upper electrode 9 is formed in the insulating film 11. The contact 10 protrudes from the insulating film 11.

Herein, in order to make the insulating film 11 of the electret condenser 50 of the present invention to close an opening 25 formed in a substrate 13 described later (see FIG. 2), the contact 10 is formed in an annular shape on the insulating film 11, as shown in FIG. 1(b). It should be noted, however, that the shape of the contact 10 is not limited particularly only if it has no break.

Moreover, a plurality of acoustic holes 12 are formed in the upper electrode 9 and the insulating film 11. The acoustic holes 11 are formed for allowing a space surrounded by the upper electrode 9, the lower electrode 4, and the insulating film 8 to communicate with the external space of the electret condenser 50 of the present invention. Namely, the electret condenser 50 of the present invention has a structure for causing the electret film 7 to vibrate upon receipt of sound pressure (see FIG. 2) through the acoustic holes 12. The cavity 2 serves as a back air chamber for the electret condenser 50 of the present invention.

One example of an electret condenser microphone according to the present embodiment will be described next.

FIG. 2 is a sectional view of an electret condenser microphone according to the present embodiment, that is, an electret condenser microphone carrying the electret condenser 50 of the present invention shown in FIG. 1(a) and FIG. 1(b).

As shown in FIG. 2, the above-described electret condenser 50 of the present invention is connected to one face of the substrate 13 in which the opening 25 is formed so as to close the opening 25. The opening 25 is formed in the substrate 13 so that the acoustic holes 12 of the electret condenser 50 of the present invention are exposed to the external space. In other words, the acoustic holes 12 communicate with the external space through the opening 25.

Specifically, the contact 10 of the electret condenser 50 of the present invention is mechanically and electrically connected to a contact 16A formed at the one face of the substrate 13. The contact 16A is electrically connected to a wiring 14A provided on the other face of and in the inside of the substrate 13. The electret condenser 50 of the present invention is electrically connected to another electric circuit on the substrate 13 through the contact 16A and the wiring 14A.

Further, an IC (Integrated Circuit) element 15 to be a drive circuit element for the microphone of the present embodiment is connected to the one face of the substrate 13. Specifically, the IC element 15 includes contacts 15a and 15b. The contact 15a is mechanically and electrically connected to one end of a wiring 14B provided at the one face of the substrate 13. The other end of the wiring 14B is mechanically and electrically connected to the extraction electrode 5 of the electret condenser 50 of the present invention. On the other hand, the contact 15b of the IC element 15 is mechanically and electrically connected to a contact 16B provided at the one face of the substrate 13. The contact 16B is electrically connected to a wiring 14C provided on the other face of and in the inside of the substrate 13. The IC element 15 is electrically connected to another electric circuit on the substrate 13 through the contact 16B and the wiring 14C.

In addition, a case 17 is mounted over the substrate 13 so as to cover the electret condenser 50 of the present invention and the IC element 15.

As described above, the contact 10 for the upper electrode 9 is formed in an annular shape on the insulating film 11 (see FIG. 1(b)). Further, the contact 16A for the substrate 13 is formed in an annular shape correspondingly so as to face the contact 10 for the upper electrode 9, whereby the following effects can be obtained. Namely, since the contact 10 and the contact 16A form an annular joint part for connecting the electret condenser 50 of the present invention and the substrate 13, sound pressure can be prevented from leaking between the substrate 13 and the electrode condenser 50 of the present invention.

Moreover, for joining the electret condenser 50 of the present invention and the substrate 13 in the present embodiment, for example, gold is used preferably as a metal material composing the contact 16A for the substrate 13 and the contact 10 for the upper electrode 9. In this case, the gold parts respectively forming the contacts 10 and 16A can be joined to each other by thermocompression bonding, facilitating joining of the contacts 10 and 16A. Even in the case where an alloy of, for example, gold and tin is used as a material of one of the contacts 10 and 16A, the contacts 10 and 16A can be joined by a similar thermocompression.

Figure 3:
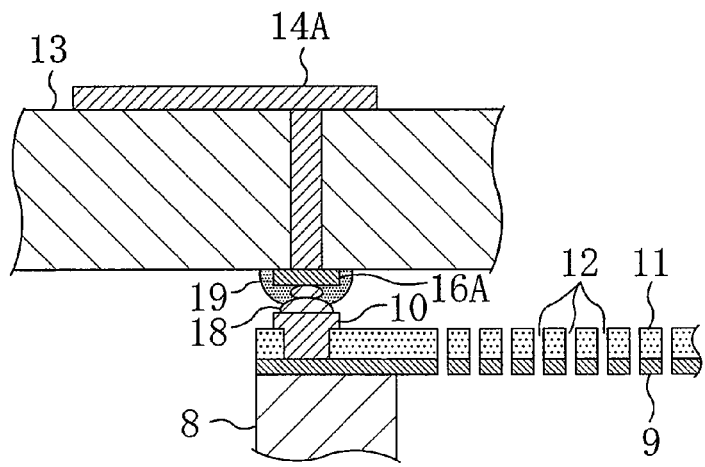
FIG. 3 is an enlarged sectional view of variation on a joint part between the electret condenser and a substrate in the electret condenser microphone according to the embodiment of the present invention.

Furthermore, any of the following methods may be employed for joining the electret condenser 50 of the present invention and the substrate 13. FIG. 3 is an enlarged sectional view showing variation on the joint part of the electret condenser and the substrate in the electret condenser microphone according to the present embodiment. As shown in FIG. 3, the contact 16A for the substrate 13 may be connected mechanically and electrically to the contact 10 for the upper electrode 9 with the use of a metal protrusion 18 which is called bump and an anisotropic conductive resin 19. In this case, the joint part can be formed in an annular shape similarly, preventing sound pressure from leaking between the substrate 13 and the electret condenser 50 of the present invention. Further, with the use of the anisotropic conductive resin 19, the temperature for joining can be set lower than a case of direct joining of the contacts 10 and 16A made of, for example, gold, reducing the burden of a manufacturing device in the microphone manufacturing process.

As described above, in the electret condenser microphone of the present embodiment, the substrate 13 and the electret condenser 50 establish electric contact therebetween at the mechanically joined part thereof, in other words, the substrate 13 and the electret condenser 50 are connected to each other electrically without using a wire bonder, resulting in suppression of parasitic capacitance and noise occurrence caused due to the presence of the bonding wire. This enhances the high-frequency characteristic of the electret condenser 50. Further, not only the cavity 2 shown in FIG. 1(a) but also the space (the internal region of the case 17) surrounded by the substrate 13 and the case 17 that covers the electret condenser 50 can be utilized as a back air chamber necessary for the electret condenser 50, increasing the substantial volume of the back air chamber for the electret condenser 50. Hence, the high-frequency characteristic of the condenser can be enhanced even when the electret condenser 50 is miniaturized.

As described above, according to the present embodiment, a small-size electret condenser microphone excellent in high-frequency characteristic, such as high-frequency stability and the like can be manufactured.

A holder formed using a resin or the like has been necessary for joining a conventional ECM to another substrate. In contrast, in the ECM of the present embodiment, provision of a solder or the like at the wiring 14 shown in FIG. 2 leads to direct joint to another substrate without using the aforementioned holder. In other words, no component for mounting the microphone is necessary.

Furthermore, in the conventional ECM, a mesh-like porous cloth called a face cloth is arranged at part where sound pressure is received for preventing dust from entering. Wherein, the porous cloth has holes each having a diameter of approximately 3 μm or larger. In contrast, when the acoustic holes 12 (see FIG. 1) of the electret condenser 50 of the present invention is set to have a diameter smaller than the holes of the porous cloth, 3 μm or smaller, dust can be prevented from entering, similarly to the conventional ECM using the face cloth. In other words, the ECM of the present embodiment eliminates the need for providing the face cloth for preventing dust from entering, leading to reduction in the number of element components. It should be noted that the shape in plan of the acoustic holes 12 is not limited to a round shape in the present embodiment, but each maximum diameter of the acoustic holes 12 is desirably set to 3 μm or smaller in a case employing a shape other than the round shape.

Moreover, in the conventional microphone manufactured by the MEMS technology, a sound input hole (corresponding to the opening 25 of the present embodiment) for the microphone is arranged basically in the upper face portion of the sound pressure sensing section of the microphone, so that a constraint is imposed on a structure of a mobile phone or the like in which the microphone is mounted. As a result, in the conventional ECM, the position of the sound input hole should have been changed by devising the shape of an acoustic shield, such as a rubber holder for covering the ECM.

Figure 4:
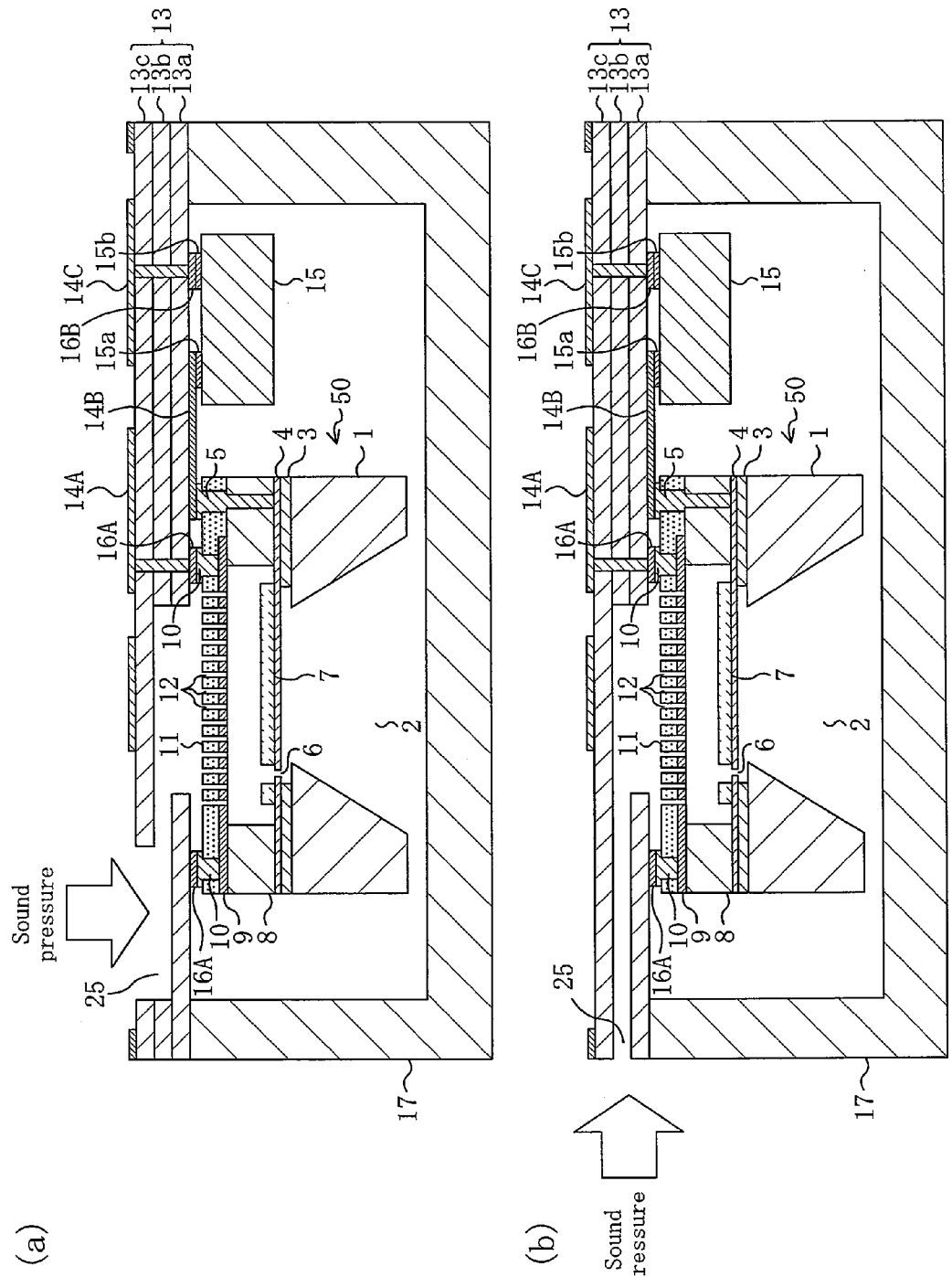
FIG. 4(*a*) and FIG. 4(*b*) are sectional views showing variation on the electret condenser microphone according to the embodiment of the present invention.

In contrast, in the present embodiment, as shown in FIG. 4(a) and FIG. 4(b), the opening 25 can be formed in the substrate 13 with part of the substrate 13 located above the acoustic holes 12 left so that the acoustic holes 12 do not overlap the opening 25 as viewed from above. In other words, the opening 25 can be formed so that the acoustic holes 12 cannot be seen from the external space. In this case, the electret condenser 50 of the present invention is not exposed to the external space directly, thereby being protected to attain a highly-reliable microphone.

Specifically, in the structure shown in FIG. 4(a) and FIG. 4(b), the substrate 13 is a ceramic multilayer substrate of, for example, three layers (a lower layer substrate 13a, an interlayer substrate 13b, and an upper layer substrate 13c) of which main component is, for example, alumina, borosilicate-based glass, or the like. This enables easy formation of a hollow to be the opening 25 in advance at the time when the substrate is a mere green sheet. Accordingly, the opening 25 for receiving sound pressure can be set in the upper face portion of the microphone as shown in FIG. 4(a) or in the side face portion of the microphone as shown in FIG. 4(b), enhancing design flexibility of a mobile phone or the like on which the microphone of the present embodiment is mounted.

Figure 5:
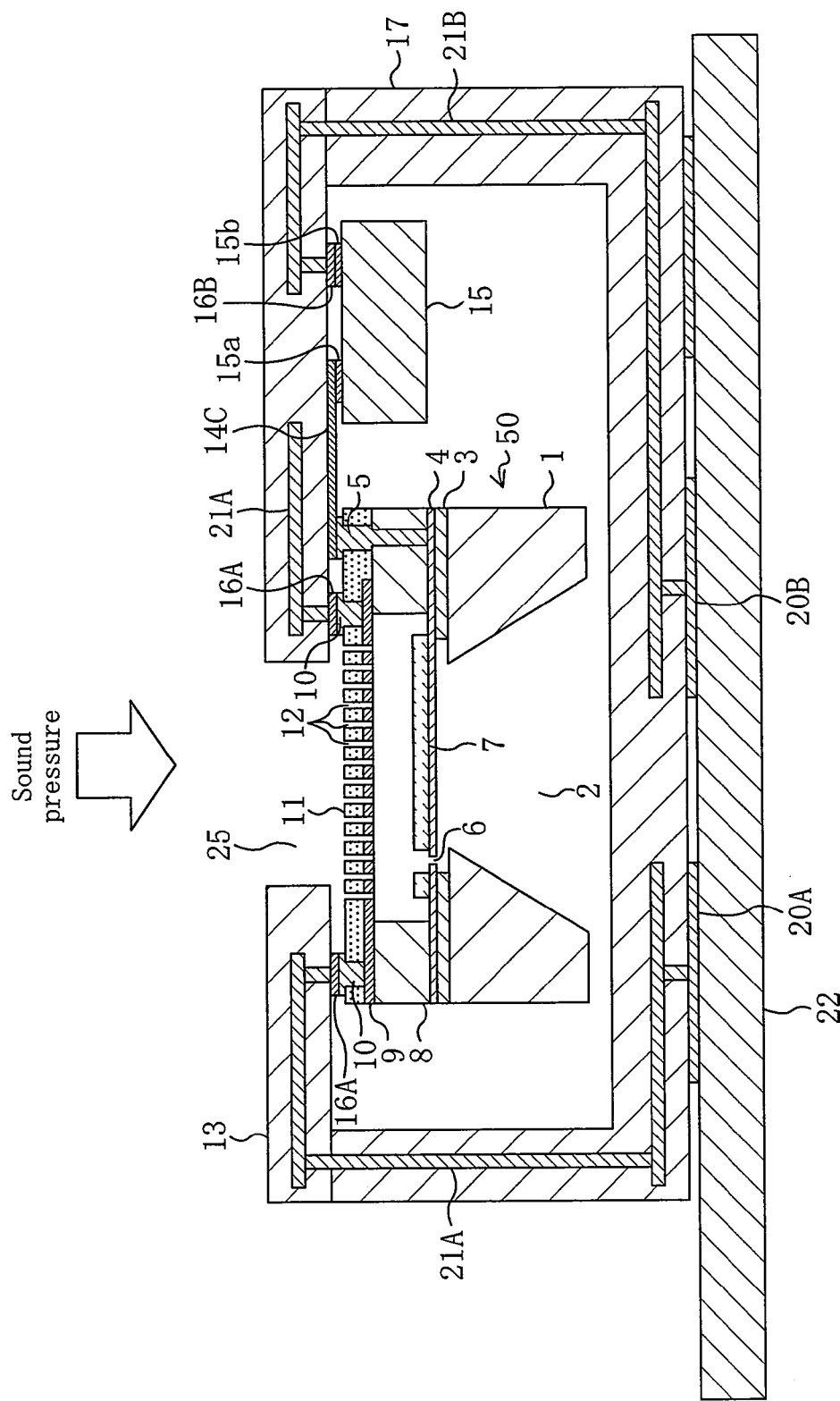
FIG. 5 is a sectional view showing a state where the electret condenser microphone according to the embodiment of the present invention is connected to another substrate.

Lastly, a method for joining the electret condenser microphone according to the present embodiment to another substrate will be described. FIG. 5 is a sectional view showing a state where the electret condenser microphone according to the present embodiment is joined to another substrate. As shown in FIG. 5, for joining the electret microphone of the present embodiment to a substrate 22, a contact 20 is formed on a surface other than the surface where the acoustic holes 12 are exposed (i.e., the obverse face of the substrate 13), for example, a surface of the case 17, and the electret condenser microphone of the present embodiment is connected to the substrate 22 electrically and mechanically by means of the contact 20. Specifically, the electret condenser 50 of the present invention is connected electrically to the substrate 22 through the contact 16A provided at the one face of the substrate 13, a wiring 21A provided inside the substrate 13 and the case 17, and a contact 20A provided at one face of the case 17. As well, the IC element 15 is connected electrically to the substrate 22 through the contact 16B provided at the one face of the substrate 13, a wiring 21B provided inside the substrate 13 and the case 17, and a contact 20B provided at the one face of the case 17.

INDUSTRIAL APPLICABILITY

The present invention relates to an electret condenser microphone. When the present invention is applied to an electret condenser microphone carrying an electret condenser formed by a MEMS technology, a small-size electret condenser microphone excellent in high-frequency characteristic can be provided to enhance reliability of a mobile phone or the like to which the microphone is mounted. Thus, the present invention is very useful.

The invention claimed is:

1. A condenser microphone comprising:
   a first substrate including a surface and an opening through which air pressure is applied;
   a condenser attached to the surface of the first substrate, adjacent to the opening, said condenser including a second substrate;
   a vibrating film attached to a surface of the second substrate and configured to vibrate in response to the air pressure applied from the opening;
   a circuit element attached to the surface of the first substrate; and
   a cover mounted over the surface of the first substrate so as to cover the condenser and the circuit element,
   wherein electric contact is established at a joint part between the condenser and the surface of the first substrate, and
   the surface of the first substrate and the surface of the second substrate face each other.

2. The condenser microphone of claim 1, wherein electric contact is established at another joint part between the circuit element and the surface of the first substrate.

3. The condenser microphone of claim 1, wherein the cover defines an internal region, and
   the condenser and the circuit element are disposed within the internal region.

4. The condenser microphone of claim 1, wherein the condenser is attached to the first substrate to cover the opening.

5. The condenser microphone of claim 1, wherein the joint part is arranged in a ring structure.

6. The condenser microphone of claim 1, wherein the first substrate is formed of a multilayer substrate.

7. The condenser microphone of claim 6, wherein the multilayer substrate is made of ceramic.

8. The condenser microphone of claim 6, wherein the opening is a hollow formed in the multilayer substrate so that the opening is not seen from an opposite surface of the surface of the first substrate.

9. The condenser microphone of claim 1, wherein the joint part includes at least one of a metal and a conductive resin.

10. The condenser microphone of claim 1, wherein the joint part includes a metal protrusion.

11. The condenser microphone of claim 1, wherein the vibrating film is attached to the surface of the second substrate via at least one of an insulating film and an electrode.

12. The condenser microphone of claim 1, wherein said second substrate includes a cavity therein and said vibrating film is arranged between the opening and the cavity.

13. The condenser microphone of claim 12, further comprising a back air chamber, said cavity defining at least a portion of said back air chamber.

14. A surface mountable package comprising:
    a first substrate including a surface and an opening through which air pressure is applied;
    a condenser attached to the surface of the first substrate, adjacent to the opening, said condenser including a second substrate;
    a vibrating film attached to a surface of the second substrate and configured to vibrate in response to the air pressure applied from the opening;
    a circuit element attached to the surface of the first substrate; and
    a cover mounted over the surface of the first substrate so as to cover the condenser and the circuit element,
    wherein electric contact is established at a joint part between the condenser and the surface of the first substrate, and
    the surface of the first substrate and the surface of the second substrate face each other.

15. The surface mountable package of claim 14, wherein electric contact is established at another joint part between the circuit element and the surface of the first substrate.

16. The surface mountable package of claim 14, wherein the cover defines an internal region, and
    the condenser and the circuit element are disposed within the internal region.

17. The surface mountable package of claim 14, wherein the condenser is attached to the first substrate to cover the opening.

18. The surface mountable package of claim 14, wherein the joint part is arranged in a ring structure.

19. The surface mountable package of claim 14, wherein the first substrate is formed of a multilayer substrate.

20. The surface mountable package of claim 19, wherein the multilayer substrate is made of ceramic.

21. The surface mountable package of claim 19, wherein the opening is a hollow formed in the multilayer substrate so that the opening is not seen from an opposite surface of the surface of the first substrate.

22. The surface mountable package of claim 14, wherein the joint part includes at least one of a metal and a conductive resin.

23. The surface mountable package of claim 14, wherein the joint part includes a metal protrusion.

24. The surface mountable package of claim 14, wherein the mountable package is secured to a substrate of a device, and
    the condenser and the substrate of the device are electrically connected through the first substrate included in the mountable package.

25. The surface mountable package of claim 14, wherein a conductive layer is formed with the first substrate.

26. The surface mountable package of claim 14, wherein a terminal pad is formed with an outer position of the surface of the first substrate.

27. The surface mountable package of claim 14, wherein the vibrating film is attached to the surface of the second substrate via at least one of an insulating film and an electrode.

28. The surface mountable package of claim 14, wherein said second substrate includes a cavity therein and said vibrating film is arranged between the opening and the cavity.

29. A condenser microphone comprising:
    a first substrate including a surface and an opening through which air pressure is applied;
    a condenser attached to the surface of the first substrate to cover the opening, said condenser comprising a second substrate which includes a cavity therein;
    a vibrating film attached to the second substrate and arranged between the opening and the cavity, said vibrating film configured to vibrate in response to the air pressure applied from the opening;
    a circuit element attached to the surface of the first substrate; and
    a cover mounted over the surface of the first substrate so as to cover the condenser and the circuit element.

30. The condenser microphone of claim 29, wherein electric contact is established at a joint part between the circuit element and the surface of the first substrate.

31. The condenser microphone of claim 30, wherein the joint part is arranged in a ring structure.

32. The condenser microphone of claim 30, wherein the joint part includes at least one of a metal and a conductive resin.

33. The condenser microphone of claim 30, wherein the joint part includes a metal protrusion.

34. The condenser microphone of claim 29, wherein the cover defines an internal region, and the condenser and the circuit element are disposed within the internal region.

35. The condenser microphone of claim 29, wherein the first substrate is formed of a multilayer substrate.

36. The condenser microphone of claim 35, wherein the multilayer substrate is made of ceramic.

37. The condenser microphone of claim 35, wherein the opening is a hollow formed in the multilayer substrate so that the opening is not seen from an opposite surface of the surface of the first substrate.

38. The condenser microphone of claim 29, wherein the vibrating film is attached to a surface of the second substrate, and the surface of the first substrate and the surface of the second substrate face each other.

39. The condenser microphone of claim 29, further comprising a back air chamber, said cavity defining at least a portion of said back air chamber.

40. A surface mountable package comprising:

a first substrate including a surface and an opening through which air pressure is applied;

a condenser attached to the surface of the first substrate to cover the opening, said condenser comprising a second substrate which includes a cavity therein;

a vibrating film attached to the second substrate and arranged between the opening and the cavity, said vibrating film configured to vibrate in response to the air pressure applied from the opening;

a circuit element attached to the surface of the first substrate; and a cover mounted over the surface of the first substrate so as to cover the condenser and the circuit element.

41. The surface mountable package of claim 40, wherein electric contact is established at a joint part between the circuit element and the surface of the first substrate.

42. The surface mountable package of claim 41, wherein the joint part is arranged in a ring structure.

43. The surface mountable package of claim 41, wherein the joint part includes at least one of a metal and a conductive resin.

44. The surface mountable package of claim 41, wherein the joint part includes a metal protrusion.

45. The surface mountable package of claim 40, wherein the cover defines an internal region, and the condenser and the circuit element are disposed within the internal region.

46. The surface mountable package of claim 40, wherein the first substrate is formed of a multilayer substrate.

47. The surface mountable package of claim 46, wherein the multilayer substrate is made of ceramic.

48. The surface mountable package of claim 46, wherein the opening is a hollow formed in the multilayer substrate so that the opening is not seen from an opposite surface of the surface of the first substrate.

49. The surface mountable package of claim 40, wherein the mountable package is secured to a substrate of a device, the condenser and the substrate of the device are electrically connected through the first substrate included in the mountable package.

50. The surface mountable package of claim 40, wherein a conductive layer is formed with the first substrate.

51. The surface mountable package of claim 40, wherein a terminal pad is formed with an outer position of the surface of the first substrate.

52. The surface mountable package of claim 40, wherein the vibrating film is attached to a surface of the second substrate, and the surface of the first substrate and the surface of the second substrate face each other.

* * * * *